(12) United States Patent
Liu

(10) Patent No.: US 11,908,983 B2
(45) Date of Patent: Feb. 20, 2024

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Junling Liu, Shenzhen (CN)

(*) Notice: Subject to any disclaimer, the term of this patent is extended or adjusted under 35 U.S.C. 154(b) by 456 days.

(21) Appl. No.: 17/419,731

(22) PCT Filed: May 26, 2021

(86) PCT No.: PCT/CN2021/095913
§ 371 (c)(1),
(2) Date: Jun. 30, 2021

(87) PCT Pub. No.: WO2022/160527
PCT Pub. Date: Aug. 4, 2022

(65) Prior Publication Data
US 2023/0155082 A1    May 18, 2023

(30) Foreign Application Priority Data
Feb. 1, 2021 (CN) .......................... 202110139534.2

(51) Int. Cl.
*H01L 33/58* (2010.01)
*H01L 25/16* (2023.01)

(52) U.S. Cl.
CPC ............ *H01L 33/58* (2013.01); *H01L 25/167* (2013.01); *H01L 2933/0058* (2013.01)

(58) Field of Classification Search
CPC ......... H01L 33/58; H01L 33/44; H01L 33/56; H01L 33/0095; H01L 2933/0058; H01L 25/167; G02F 1/133512; G02F 1/133509; G02F 1/136209; H10K 59/13
See application file for complete search history.

(56) References Cited

U.S. PATENT DOCUMENTS

| 11,526,079 B2* | 12/2022 | Huang ................ H01L 27/156 |
| 2002/0054252 A1* | 5/2002 | Ishii ...................... G02B 5/201 349/106 |
| 2010/0029028 A1 | 2/2010 | Song |

(Continued)

FOREIGN PATENT DOCUMENTS

| CN | 102270647 A | 12/2011 |
| CN | 105826355 A | 8/2016 |

(Continued)

*Primary Examiner* — Michael Carter
*Assistant Examiner* — Lawrence C Tynes, Jr.

(57) ABSTRACT

The present application discloses a display panel and a manufacturing method thereof. The display panel manufacturing method includes forming an LED die including a sacrificial layer on an array substrate, and then coating black glue material on the array substrate. The black glue material covers the array substrate and a surface of the sacrificial layer away from the array substrate. Then, the black glue material and the sacrificial layer are heated, and the black glue material is cured to form a black glue layer such that the sacrificial layer is decomposed. The display panel and the manufacturing method thereof provided by the present application are for improving contrast of the display panel.

20 Claims, 4 Drawing Sheets

(56) References Cited

U.S. PATENT DOCUMENTS

2016/0266436 A1\* 9/2016 Jiao ................ H10K 50/828
2020/0373469 A1 11/2020 Chen
2021/0050236 A1\* 2/2021 Ahn ................ H01L 21/6838

FOREIGN PATENT DOCUMENTS

| CN | 107657904 A | 2/2018 |
| CN | 108139796 A | 6/2018 |
| CN | 111081685 A | 4/2020 |
| CN | 111326082 A | 6/2020 |
| CN | 111446348 A | 7/2020 |
| CN | 111564465 A | 8/2020 |
| CN | 111710691 A | 9/2020 |
| CN | 112071969 A | 12/2020 |
| CN | 112150936 A | 12/2020 |
| JP | H09102595 A | 4/1997 |
| KR | 20130129008 A | 11/2013 |

\* cited by examiner

DISPLAY PANEL AND MANUFACTURING METHOD THEREOF

FIELD OF INVENTION

The present application relates to a field of display technologies, especially to a display panel and a manufacturing method thereof.

BACKGROUND OF INVENTION

A mini light emitting diode (mini LED) display panel or a micro light emitting diode (micro LED) display panel is configured to directly display or serve as a backlight source of a display device, and has been developed extensively. Compared to liquid crystal display (LCD) panel and organic light-emitting diode (OLED) display panel, the mini LED display panel has advantages such as fast response, high color gamut, high pixels per inch (PPI), and low energy consumption.

However, mini LED and micro LED technologies are difficult and complex, especially their key technology of massive transfer technology, and micronization of LED dies has become a technical bottleneck. A mini-LED display panel is a technology that transfers LED dies to a backplate and uses a device included by the backplate itself or transferred to the backplate to drive the LED dies to emit light. Such type of product can be used as a backlight to control partitions, and can also be used as a mini LED display panel for direct display, that is, a direct display. When mini LED products are used as direct display products, they have higher contrast requirements.

Therefore, it is necessary to set forth a new technical solution to resolve the technical issue of a low contrast of the conventional display panel.

SUMMARY OF INVENTION

Technical Issue

An embodiment of the present application provides a display panel and a manufacturing method thereof for improving contrast of the display panel.

Technical Solution

The embodiment of the present application provides a display panel manufacturing method comprising steps as follows:
  providing an array substrate, wherein the array substrate comprises a first surface and a second surface disposed oppositely;
  forming a light emitting diode (LED) die including a sacrificial layer on the first surface, wherein the LED die is disposed on the array substrate, the sacrificial layer is disposed on a surface of the LED die away from the array substrate;
  coating black glue material on the array substrate, wherein the black glue material covers the first surface and covers a surface of the sacrificial layer away from the array substrate; and
  heating the black glue material and the sacrificial layer under a predetermined temperature such that the black glue material is cured to form a black glue layer and the sacrificial layer is decomposed.

In the display panel manufacturing method provided by the embodiment of the present application, before the step of forming an LED die including a sacrificial layer on the first surface, the method further comprises:
  coating material of the sacrificial layer on the LED die to form the LED die including the sacrificial layer.

In the display panel manufacturing method provided by the embodiment of the present application, material of the sacrificial layer is citric acid colloid.

In the display panel manufacturing method provided by the embodiment of the present application, before the step of forming an LED die including a sacrificial layer on the first surface, the method further comprises:
  coating precursor fluid of citric acid colloid on the LED die; and
  disposing the LED die in a vacuum dryer and stoving the LED die under a temperature from 80 degrees Celsius to 120 degrees Celsius to form the LED die including the sacrificial layer.

In the display panel manufacturing method provided by the embodiment of the present application, the step of forming an LED die including a sacrificial layer on the first surface comprises:
  by a die pick and place process, a die stabbing process, or a laser transferring process, forming the LED die including the sacrificial layer on the first surface.

In the display panel manufacturing method provided by the embodiment of the present application, after the step of heating the black glue material and the sacrificial layer under a predetermined temperature, the method further comprises:
  performing a cleaning process and an air drying process on the surface of the LED die away from the array substrate.

In the display panel manufacturing method provided by the embodiment of the present application, after the step of performing a cleaning process and an air drying process on the surface of the LED die away from the array substrate, the method further comprises:
  forming a transparent glue layer on a surface of the black glue layer away from the array substrate, wherein the transparent glue layer covers the LED die.

In the display panel manufacturing method provided by the embodiment of the present application, the step of performing a cleaning process and an air drying process on the surface of the LED die away from the array substrate comprises:
  cleaning the array substrate by spraying or drenching; and
  by a blower, air-drying a detergent remaining on the array substrate.

In the display panel manufacturing method provided by the embodiment of the present application, the predetermined temperature is greater than 140 degrees Celsius.

In the display panel manufacturing method provided by the embodiment of the present application, a thickness of the sacrificial layer ranges from 1 micron to 120 microns.

In the display panel manufacturing method provided by the embodiment of the present application, a coating thickness of the black glue material is three times less than the thickness of the sacrificial layer.

The embodiment of the present application further comprises a display panel manufacturing method comprising steps as follows:
  providing an array substrate, wherein the array substrate comprises a first surface and a second surface disposed oppositely;
  coating material of a sacrificial layer on a light emitting diode (LED) die to form the LED die including the sacrificial layer, wherein the LED die is disposed on the array substrate, the sacrificial layer is disposed on a surface of the LED die away from the array substrate;

coating black glue material on the array substrate, wherein the black glue material covers the first surface and covers a surface of the sacrificial layer away from the array substrate;

heating the black glue material and the sacrificial layer under a predetermined temperature such that the black glue material is cured to form a black glue layer and the sacrificial layer is decomposed;

performing a cleaning process and an air drying process on the surface of the LED die away from the array substrate; and forming a transparent glue layer on a surface of the black glue layer away from the array substrate, wherein the transparent glue layer covers the LED die.

In the display panel manufacturing method provided by the embodiment of the present application, material of the sacrificial layer is citric acid colloid.

In the display panel manufacturing method provided by the embodiment of the present application, the step of forming an LED die including a sacrificial layer on the first surface comprises:

by a die pick and place process, a die stabbing process, or a laser transferring process, forming the LED die including the sacrificial layer on the first surface.

In the display panel manufacturing method provided by the embodiment of the present application, the predetermined temperature is greater than 140 degrees Celsius.

In the display panel manufacturing method provided by the embodiment of the present application, a thickness of the sacrificial layer ranges from 1 micron to 120 microns.

In the display panel manufacturing method provided by the embodiment of the present application, a coating thickness of the black glue material is three times less than the thickness of the sacrificial layer.

In the display panel manufacturing method provided by the embodiment of the present application, the predetermined temperature is greater than 140 degrees Celsius.

The embodiment of the present application further provides a display panel, the display panel is manufactured by the above-mentioned display panel manufacturing method, and the display panel comprises an array substrate, LED die and a black glue layer;

the array substrate comprises a first surface and a second surface disposed oppositely;

the LED die is disposed on the first surface; and the black glue layer is disposed on first surface.

In the display panel provided by the embodiment of the present application, the display panel further comprises a transparent glue layer, and the transparent glue layer is disposed on a surface of the black glue layer away from the array substrate.

Advantages

The embodiment of the present application provides a display panel and a manufacturing method thereof. In the display panel manufacturing method provided by the embodiment of the present application, first, an LED die including a sacrificial layer is formed on a first surface of an array substrate, wherein the sacrificial layer is disposed on a surface of the LED die away from array substrate. Then, a black glue material is coated on the first surface of the array substrate. Finally, the black glue material is cured under a predetermined temperature to form a black glue layer. Furthermore, during heating and curing processes, the sacrificial layer is decomposed. Because the surface of the LED die away from the array substrate of the display panel of the embodiment of the present application is not covered by the black glue material, the display panel manufacturing method provided by the embodiment of the present application can be configured to improve contrast of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
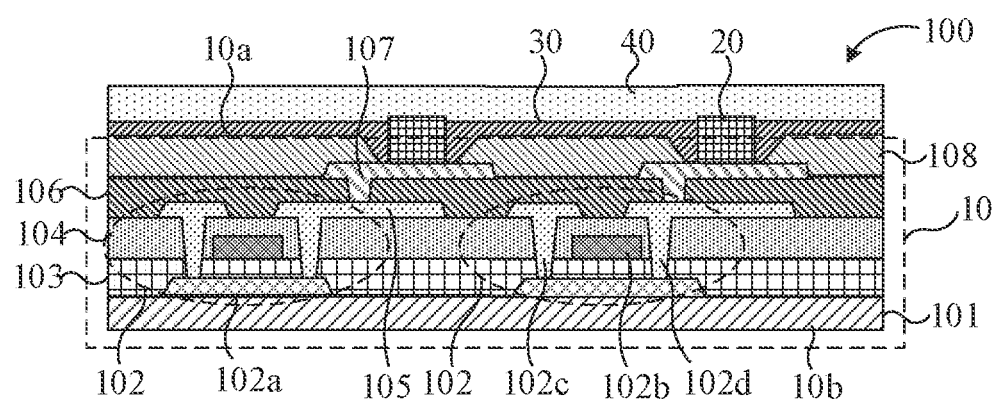
FIG. 1 is a schematic structural view of a display panel provided by an embodiment of the present application.

To make the purpose, technical solutions and advantages of the present invention clearer, the present invention will be further described in detail below in conjunction with the accompanying drawings. Please refer to the drawings in the accompanying drawings, where the same reference characters represent the same elements. The following description is based on the specific embodiments shown in the present invention, which should not be regarded as limiting the present invention other specific embodiment not detailed here. The word "embodiment" used in this specification means an example, exemplary instance or illustration.

With reference to FIG. 1, the embodiment of the present application provides a display panel, and the display panel 100 comprises an array substrate 10, an LED die 20, a black glue layer 30, and a transparent glue layer 40.

The array substrate 10 comprises a first surface 10a and a second surface 10b disposed oppositely. The LED die 20 is disposed on the first surface 10a, and the black glue layer 30 is disposed on the first surface 10a. The transparent glue layer 40 is disposed on a surface of the black glue layer 30 away from array substrate 10.

Specifically, array substrate 10 comprises a base layer 101, a thin film transistor 102, a gate electrode insulation layer 103, an interlayer dielectric layer 104, a conductive pad 105, a first passivation layer 106, a first electrode 107, and a second passivation layer 108.

In some embodiments, the base layer 101 can comprise a first flexible underlay layer, a silicon dioxide layer, a second flexible underlay layer, and a buffer layer disposed sequentially on one another. Material of the second flexible underlay layer is the same as material of the first flexible underlay, and the material can comprise at least one of polyimide (PI), polyethylene dicarboxylate (PET), polyethylene naphthalate (PEN), polycarbonate (PC), polyether (PES), aromatic fluorotoluene containing polyarylates (PAR), or polycyclic olefins (PCO). The buffer layer is composed of one, two, or more of stack structures of nitride containing silicon, oxide containing silicon, or nitrogen oxide containing silicon.

The thin film transistor 102 comprises an active layer 102a, a gate electrode 102b, a source electrode 102c, and a drain electrode 102d. The active layer 102a is disposed on the base layer 101, and the active layer 102a comprises a channel region and a doping region. The doping region is located on two sides of the channel region. The active layer 102a can also be an oxide active layer or a low temperature polysilicon active layer. For example, in some embodiments, material of the active layer 102a is indium tin oxide, and the material can also be Ln-IZO, ITZO, ITGZO, HIZO, IZO (InZnO), ZnO:F, $In_2O_3$:Sn, $In_2O_3$:Mo, $Cd_2SnO_4$, ZnO:Al, $TiO_2$:Nb, Cd—Sn—O, or other metal oxides. The doping region can be a P-type doping region or an N-type doping region. When the doping region is the P-type doping region, a doping element of the doping region is a mixture of one or two of boron and indium. When the doping region is the N-type doping region, the doping element of the doping region a mixture of one or more of phosphorus, arsenic, and antimony.

The gate electrode insulation layer 103 covers the active layer 102a and the base layer 101. Material of the gate electrode insulation layer 103 can be one of silicon nitride, silicon oxide, silicon oxynitride, or aluminum oxide ($Al_2O_3$), or a combination thereof.

The gate electrode 102b is disposed on the gate electrode insulation layer 103, and an orthographic projection of the gate electrode 102b on the base layer 101 is completely covered by an orthographic projection of the active layer 102a on the base layer 101. Material of the gate electrode 102b can be selected from metals such as Cr, W, Ti, Ta, Mo, Al, or Cu, or alloy thereof. A gate metal layer composed of multiple layers of metal can also meet the demands.

The interlayer dielectric layer 104 covers the gate electrode insulation layer 103 and the gate electrode 102b. The interlayer dielectric layer 104 can be selected from oxide or nitrogen oxide.

The source electrode 102c and the drain electrode 102d are electrically connected to the doping region on the two sides of the channel region. The source electrode 102c and the drain electrode 102d can be selected from metals such as Cr, W, Ti, Ta, Mo, Al, or Cu, or alloy thereof. A gate metal layer composed of multi-layer metal can also meet the needs.

The conductive pad 105 is electrically connected to the drain electrode 102d. The first passivation layer 106 is disposed on a surface of the interlayer dielectric layer 104 away from gate electrode insulation layer 103, and the first passivation layer 106 covers the interlayer dielectric layer 104, the source electrode 102c, the drain electrode 102d, and the conductive pad 105. The first electrode 107 is connected to the conductive pad 105 through a via hole.

The second passivation layer 108 covers the first electrode 107 and the first passivation layer 106, and exposes the first electrode 107.

Material of the first passivation layer 106 and the second passivation layer 108 can be inorganic non-metal film layer material such as a lamination layer of $SiO_x$, $SiO_x/SiN_x$ or a lamination layer of $SiO_x/SiN_x/Al_2O_3$.

It should be explained that the display panel 100 provided by the embodiment of the present application can be used for direct display, or the display panel 100 can serve as a backlight source of a liquid crystal display device.

The display panel provided by the embodiment of the present application forms an LED die including a sacrificial layer on a first surface of an array substrate. The sacrificial layer is disposed on a surface of the LED die away from array substrate. Then, black glue material is coated on the first surface of the array substrate. Finally, the black glue material under a predetermined temperature is cured to form a black glue layer. Furthermore, during a heating and curing process, the sacrificial layer is decomposed. Because a surface of the LED die of the display panel provided by the embodiment of the present application away from array substrate is not covered by the black glue material, the display panel of the embodiment of the present application can be used for improving contrast of the display panel.

Figure 2:
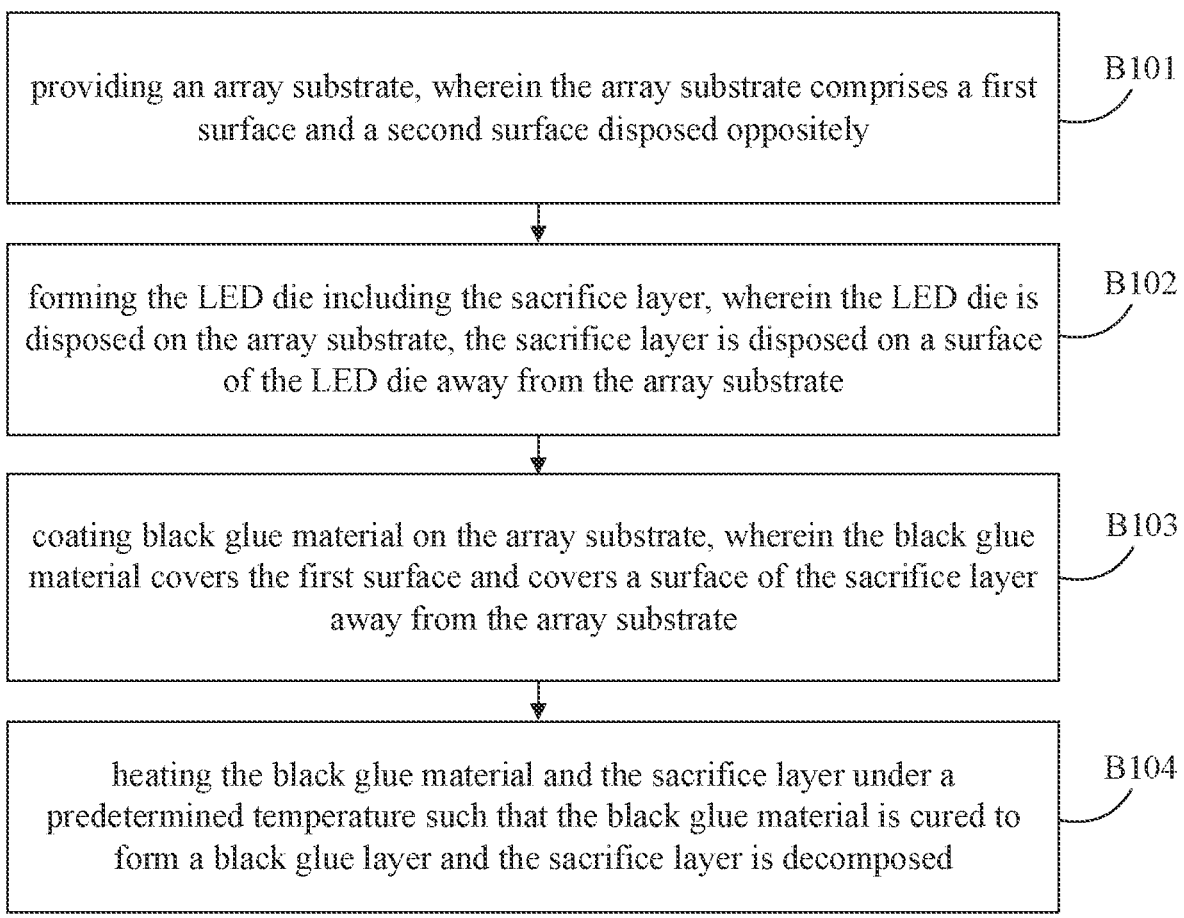
FIG. 2 is a step flowchart of a display panel manufacturing method provided by the embodiment of the present application.

With reference to FIG. 2, the embodiment of the present application also provides a display panel manufacturing method comprising steps as follows:

A step B101 comprises providing an array substrate, wherein the array substrate comprises a first surface and a second surface disposed oppositely.

Figure 3:
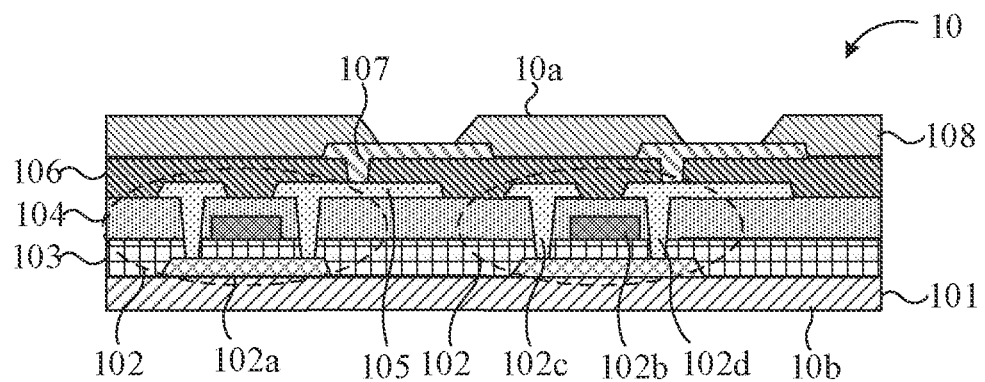
FIG. 3 is a schematic view of a step B101 of the display panel manufacturing method provided by the embodiment of the present application.

Specifically, with reference to FIG. 3, FIG. 3 is a schematic view of the step B101 of the display panel manufacturing method provided by the embodiment of the present application. The step B101 comprises the following steps:

First, a metal oxide layer is deposited on a base layer 101, and the metal oxide layer is patterned to form an active layer 102a. Specifically, a metal oxide layer can be deposited by a physical vapor sputtering process, and the metal oxide layer is processed by a photolithography process to form the active layer 102a. In some embodiments, material of the active layer 102a comprises metal oxide, for example, indium gallium zinc oxide, indium gallium tin oxide, and indium gallium zinc tin oxide. A thickness of the active layer 102a ranges from 400 Å to 800 Å, including 400 Å and 800 Å.

Second, a gate electrode insulation layer 103 is deposited and formed by a chemical vapor deposition process. The gate electrode insulation layer 103 covers the base layer 101 and the active layer 102a. Material of the gate electrode insulation layer 103 can be a lamination layer of $SiO_x$, $SiO_x/SiN_x$ or a lamination layer of $SiO_x/SiN_x/Al_2O_3$, and a thickness thereof ranges from 2000 Å-5000 Å, including 2000 Å and 5000 Å.

Then, a metal layer is deposited on the gate electrode insulation layer 103 by a chemical vapor deposition process. The metal layer is patterned to form a gate electrode 102b by a wet etching process or a metal stripping process.

Then, an interlayer dielectric layer 104 is formed on the gate electrode insulation layer 103 and the gate electrode 102b. In some embodiments, the interlayer dielectric layer 104 can be deposited by a chemical vapor deposition process.

Then, a second metal layer is formed on the base layer 101. The second metal layer comprises a source electrode 102c, a drain electrode 102d, and a conductive pad 105. The source electrode 102c and the drain electrode 102d are electrically connected to the active layer 102a through via holes, respectively. The conductive pad 105 is electrically connected to the drain electrode 102d. The conductive pad 105 is configured to bond the LED die.

Finally, a first passivation layer 106, a first electrode 107, and a second passivation layer 108 are sequentially formed on the second metal layer to form an array substrate 10. An aperture is defined in the second passivation layer 108, and the aperture exposes the first electrode 107. A first surface 10a and a second surface 10b are disposed oppositely on the array substrate 10.

A step B102 comprises forming an LED die comprising a sacrificial layer on the first surface, wherein the LED die is disposed on the array substrate, and the sacrificial layer is disposed on a surface of the LED die away from array substrate.

Figure 4:
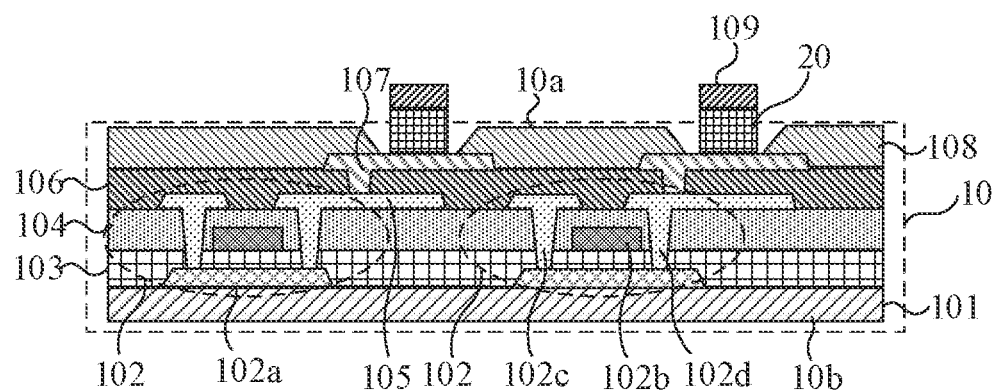
FIG. 4 is a schematic view of a step B102 of the display panel manufacturing method provided by the embodiment of the present application.

Specifically, with reference to FIG. 4, an LED die 20 comprising a sacrificial layer 109 is formed in the aperture of the first surface 10a. A surface of the LED die 20 is disposed in the aperture and is electrically connected to the first electrode 107. The sacrificial layer 109 is disposed on the surface of the LED die 20 away from the array substrate 10.

In some embodiments, the step of forming the LED die 20 including the sacrificial layer 109 on the first surface 10a comprises:

The LED die 20 comprising the sacrificial layer 109 is formed on the first surface 10a by a die pick and place process, a die stabbing process, or a laser transferring process. The LED dies 20 disposed by the die pick and place process, the die stabbing process, or the laser transferring process have high assembly density, small size of electronic products, light weight, high reliability, strong vibration resistance, low solder joint defect rate, and excellent high frequency characteristics. Such method reduces electromagnetic and radio frequency interference, is easy to realize automation, improves production efficiency, reduces costs, and saves material, energy, equipment, manpower, and time. Mass transfer comprises electrostatic force transfer, Van der Waals force transfer, and magnetic force transfer. The LED dies 20 disposed by mass transfer have highly uniform brightness and arrangement.

In some embodiments, before the step of forming the LED die comprising the sacrificial layer 109 on the first surface 10a, the method further comprises coating a material of the sacrificial layer 109 on the LED die 20 to form the LED die 20 comprising the sacrificial layer 109. The material of the sacrificial layer 109 is citric acid colloid.

In some embodiments, material of the sacrificial layer 109 can also be other organic acid colloid, for example, trimer acid colloid.

In some embodiments, a thickness of the sacrificial layer 109 ranges from 1 micron to 120 microns. For example, the thickness of the sacrificial layer 109 is one of 1 micron, 5 microns, 10 microns, 25 microns, 40 microns, 60 microns, 80 microns, 100 microns, or 120 microns.

For example, in a specific embodiment, the step of forming the LED die 20 including a sacrificial layer 109 comprises:

Precursor fluid of citric acid colloid is coated on a blue film including a large number of LED dies, and the precursor fluid of the citric acid colloid comprises a mixture solution of at least one of magnesium chloride, nickel chloride, or manganese chloride, citric acid, ethanol, and water. Citric acid has very strong complexity in a solution, and metal positive ions in the solution are complexed by citric acid molecules to form a stable net structure where positive ions are distributed evenly. A citric acid gel process is using a plurality of hydroxyl groups of citric acid for complexation with metal ions to form citrate sol, and dehydration is directly implemented without effect of multifunctional group alcohol to form foamy dry gel. Specifically, the embodiment of the present application dissolves magnesium chloride with a mass percentage of 30% and citric acid with a mass percentage of 70% into a mixture solution of ethanol and water, and agitates the solution under a temperature of 60 degrees Celsius to 70 degrees Celsius until the citric acid and the magnesium chloride are completely dissolved to form precursor fluid of citric acid colloid. Then, the precursor fluid of the citric acid colloid is coated on the LED die, and the LED die is disposed in a vacuum dryer, and ethanol and water are stoved between 80 degrees Celsius and 120 degrees Celsius to form citric acid colloid.

In some embodiments, to make the LED die have a suitable size, after forming the LED die 20 comprising the sacrificial layer 109, the step also includes patterning according to the size of the LED die. For example, the LED die 20 can be patterned by a yellow light process or a cutting process to form an LED die 20 with a suitable size.

A step B103 comprises coating black glue material on the array substrate, wherein the black glue material covers the first surface and covers a surface of the sacrificial layer away from array substrate.

Figure 5:
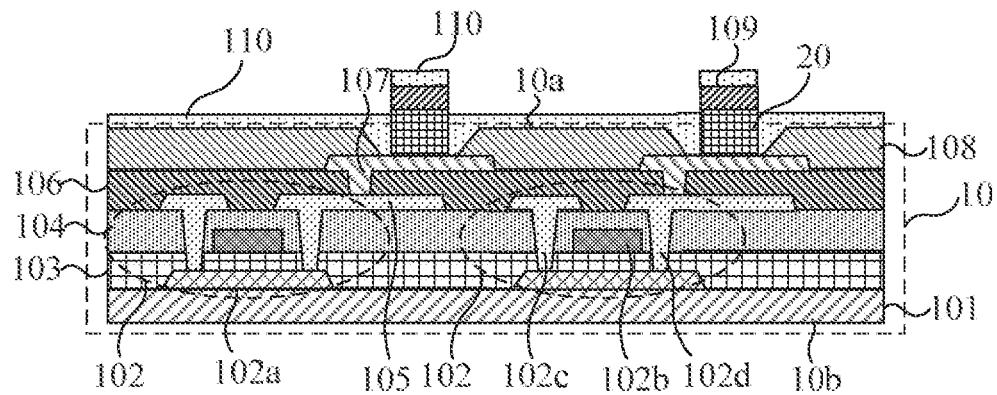
FIG. 5 is a schematic view of a step B103 of the display panel manufacturing method provided by the embodiment of the present application.

Specifically, with reference to FIG. 5, black glue material 110 is coated on a first surface 10a of the array substrate 10 and a surface of the sacrificial layer 109 away from LED die 20, and the black glue material 110 can be silicone or epoxy glue.

In an embodiment, to ensure uniformity of a thickness of the coated black glue material, the present embodiment employs a coating method with a small amount and multiple times for coating the black glue material 110 to form a black glue material layer with an even thickness.

In some embodiments, a coating thickness of the black glue material 110 is three times less than the sacrificial layer 109. Such configuration makes the black glue material 110 unable to cover the side of the LED die 20, which facilitates detaching the black glue material 110 out of the LED die 20 during subsequent heating of the black glue material 110 and the sacrificial layer 109.

The step B104 comprises under a predetermined temperature heating the black glue material and the sacrificial layer, such that the black glue material is cured to form a black glue layer and the sacrificial layer is decomposed.

Figure 6:
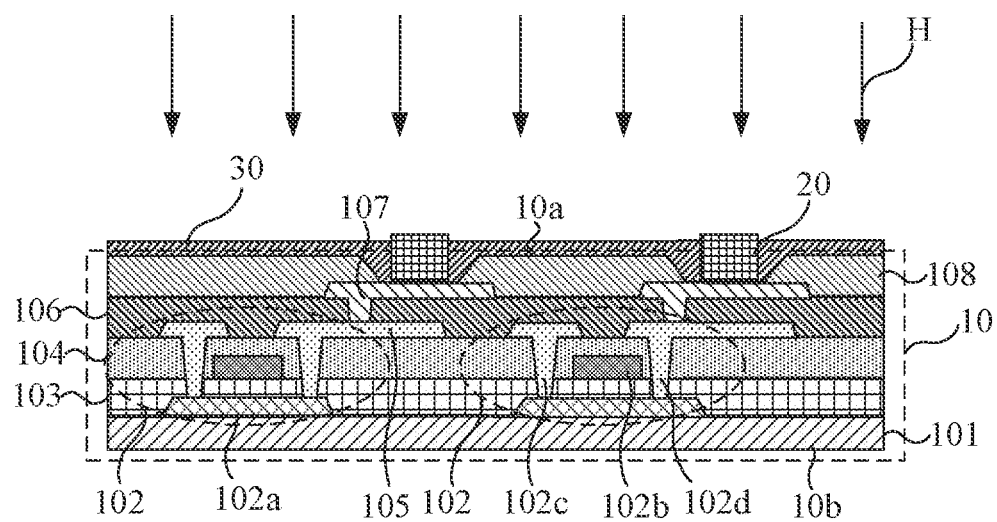
FIG. 6 is a schematic view of a step B104 of the display panel manufacturing method provided by the embodiment of the present application.

Specifically, with reference to FIGS. 5 and 6, under the predetermined temperature, a heating device is used to heat the black glue material 110 and the sacrificial layer 109. During the heating process, the black glue material is cured to form a black glue layer 30, and the sacrificial layer 109 is decomposed.

Taking material of the sacrificial layer 109 being citric acid colloid as an example, when a heating temperature is greater than a decomposing temperature of the citric acid colloid, the citric acid colloid is decomposed into acetone dicarboxylic acid, hydrogen, and carbon dioxide. Then, during a subsequent heating process, acetone dicarboxylic acid is decomposed into carbon dioxide and water vapor. As such, the citric acid colloid is decomposed, the black glue material 110 on the citric acid colloid is detached accordingly, which realizes a surface of the LED die 20 away from array substrate 10 not covered by the black glue material 110 and improves contrast of the display panel.

In some embodiments, predetermined temperature is greater than 140 degrees Celsius, for example, the predetermined temperature is 140 degrees Celsius, 160 degrees Celsius, 180 degrees Celsius, or 200 degrees Celsius. In other words, in the present embodiment, the predetermined temperature is greater than a temperature at which the sacrificial layer 109 is decomposed. A purpose thereof is to use the predetermined temperature to decompose the sacrificial layer 109 during the curing process.

In some embodiments, after the step B104, the method further comprises performing a cleaning process and an air drying process to the surface of the LED die 20 away from array substrate 10 to clean off residue of the sacrificial layer 109 on the LED die 20 and the black glue material 110 attached on the LED die 20. Specifically, the array substrate 10 is cleaned by spraying or drenching. Then, a blower is used to air-dry detergent on the array substrate 10.

With reference to FIG. 1, In some embodiments, after the step of performing the cleaning process and the air drying process on the surface of the LED die 20 away from array substrate 10, the method further comprises:

forming a transparent glue layer 40 on a surface of the black glue layer 30 away from array substrate 10, wherein the transparent glue layer 40 covers the LED die 20. The transparent glue layer 40 is configured to transmit light emitted from the LED die 20 such that the light emitted from the LED die 20 can be visible to human eyes.

The embodiment of the present application provides a display panel and a manufacturing method thereof. In the display panel manufacturing method provided by the embodiment of the present application, first, an LED die including a sacrificial layer is formed on a first surface of an array substrate, wherein the sacrificial layer is disposed on a surface of the LED die away from array substrate. Then, black glue material is coated on the first surface of the array substrate. Finally, the black glue material is cured under a predetermined temperature to form a black glue layer. Furthermore, during heating and curing processes, the sacrificial layer is decomposed. Because the surface of the LED die away from array substrate of the display panel of the embodiment of the present application is not covered by the black glue material, the display panel manufacturing method provided by the embodiment of the present application can be configured to improve contrast of the display panel.

Furthermore, the display panel manufacturing method provided by the embodiment of the present application can also prevent an issue that a gap between the black glue layer and the LED die due to a process influences optical performance of the display panel. It can also prevent an issue that damages to the LED die resulting from a grinding process influence reliability of the display panel.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display panel manufacturing method, comprising steps as follows:
    providing an array substrate, wherein the array substrate comprises a first surface and a second surface disposed oppositely;
    forming a light emitting diode (LED) die including a sacrificial layer on the first surface, wherein the LED die is disposed on the array substrate, and the sacrificial layer is disposed on a surface of the LED die away from the array substrate;
    coating a black glue material on the array substrate, wherein the black glue material covers the first surface and covers a surface of the sacrificial layer away from the array substrate; and
    heating the black glue material and the sacrificial layer under a predetermined temperature such that the black glue material is cured to form a black glue layer and the sacrificial layer is decomposed.

2. The display panel manufacturing method according to claim 1, wherein before the step of forming the LED die including the sacrificial layer on the first surface, the method further comprises:
    coating a material of the sacrificial layer on the LED die to form the LED die including the sacrificial layer.

3. The display panel manufacturing method according to claim 2, wherein the material of the sacrificial layer is citric acid colloid.

4. The display panel manufacturing method according to claim 3, wherein before the step of forming the LED die including the sacrificial layer on the first surface, the method further comprises:
    coating a precursor fluid of citric acid colloid on the LED die; and
    disposing the LED die in a vacuum dryer and stoving the LED die under a temperature of 80 degrees Celsius to 120 degrees Celsius to form the LED die including the sacrificial layer.

5. The display panel manufacturing method according to claim 1, wherein the step of forming the LED die including the sacrificial layer on the first surface comprises:
    forming the LED die including the sacrificial layer on the first surface by a die pick and place process, a die stabbing process, or a laser transferring process.

6. The display panel manufacturing method according to claim 1, wherein after the step of heating the black glue material and the sacrificial layer under the predetermined temperature, the method further comprises:
    performing a cleaning process and an air drying process on the surface of the LED die away from the array substrate.

7. The display panel manufacturing method according to claim 6, wherein after the step of performing the cleaning process and the air drying process on the surface of the LED die away from the array substrate, the method further comprises:
    forming a transparent glue layer on a surface of the black glue layer away from the array substrate, wherein the transparent glue layer covers the LED die.

8. The display panel manufacturing method according to claim 6, wherein the step of performing the cleaning process and the air drying process on the surface of the LED die away from the array substrate comprises:
    cleaning the array substrate by spraying or drenching; and
    air-drying a detergent remaining on the array substrate by a blower.

9. The display panel manufacturing method according to claim 1, wherein the predetermined temperature is greater than 140 degrees Celsius.

10. The display panel manufacturing method according to claim 1, wherein a thickness of the sacrificial layer ranges from 1 micron to 120 microns.

11. The display panel manufacturing method according to claim 10, wherein a coating thickness of the black glue material is three times less than the thickness of the sacrificial layer.

12. A display panel, wherein the display panel is manufactured by the display panel manufacturing method according to claim 1, the display panel comprises the array substrate, the LED die, and the black glue layer;
    the array substrate comprises the first surface and the second surface disposed oppositely;

the LED die is disposed on the first surface; and
the black glue layer is disposed on the first surface.

13. The display panel according to claim 12, wherein the display panel further comprises a transparent glue layer, and the transparent glue layer is disposed on a surface of the black glue layer away from the array substrate.

14. A display panel manufacturing method, comprising steps as follows:
provi ding an array substrate, wherein the array substrate comprises a first surface and a second surface disposed oppositely;
coating a material of a sacrificial layer on a light emitting diode (LED) die to form the LED die including the sacrificial layer, wherein the LED die is disposed on the array substrate, and the sacrificial layer is disposed on a surface of the LED die away from the array substrate;
coating a black glue material on the array substrate, wherein the black glue material covers the first surface and covers a surface of the sacrificial layer away from the array substrate;
heating the black glue material and the sacrificial layer under a predetermined temperature such that the black glue material is cured to form a black glue layer and the sacrificial layer is decomposed;
performing a cleaning process and an air drying process on the surface of the LED die away from the array substrate; and
forming a transparent glue layer on a surface of the black glue layer away from the array substrate, wherein the transparent glue layer covers the LED die.

15. The display panel manufacturing method according to claim 14, wherein the material of the sacrificial layer is citric acid colloid.

16. The display panel manufacturing method according to claim 14, wherein the step of forming the LED die including the sacrificial layer on the first surface comprises:
forming the LED die including the sacrificial layer on the first surface by a die pick and place process, a die stabbing process, or a laser transferring process.

17. The display panel manufacturing method according to claim 14, wherein the predetermined temperature is greater than 140 degrees Celsius.

18. The display panel manufacturing method according to claim 14, wherein a thickness of the sacrificial layer ranges from 1 micron to 120 microns.

19. The display panel manufacturing method according to claim 18, wherein a coating thickness of the black glue material is three times less than the thickness of the sacrificial layer.

20. The display panel manufacturing method according to claim 14, wherein the predetermined temperature is greater than 140 degrees Celsius.

* * * * *